United States Patent [19]

Schnizlein

[11] 4,414,538
[45] Nov. 8, 1983

[54] KEYBOARD SENSE GATE

[75] Inventor: Paul G. Schnizlein, Des Plaines, Ill.

[73] Assignee: Teletype Corporation, Skokie, Ill.

[21] Appl. No.: 327,859

[22] Filed: Dec. 7, 1981

[51] Int. Cl.³ .............................................. G06F 3/02
[52] U.S. Cl. ............................ 340/365 S; 340/365 E; 340/365 C; 364/710
[58] Field of Search ............ 340/365 S, 365 C, 365 R, 340/365 E; 364/709, 710; 179/90 K; 178/17 C; 400/479, 479.1, 479.2; 200/DIG. 1, 52 R, 5 A

[56] References Cited

U.S. PATENT DOCUMENTS

| | | | |
|---|---|---|---|
| 3,721,976 | 3/1973 | Kuijsten | 340/365 E |
| 3,740,744 | 6/1973 | Nakada et al. | 340/365 E |
| 4,157,539 | 6/1979 | Hunts et al. | 340/365 S |

Primary Examiner—Donnie Lee Crosland
Attorney, Agent, or Firm—W. K. Serp; J. C. Albrecht

[57] ABSTRACT

Twenty-five capacitive keyswitches 16a-e are arranged in a matrix having five row conductors 12a-e and five column conductors 14a-e. A series of five pulses are fed to each row conductor 14a-e in succession through AND gates 41a-e controlled by a counter 34. Each time a row conductor 12a-e is pulsed, all of the column conductors 14a-e are scanned. When one of the column conductors 14a-e is scanned, the associated coupling transistor 54a-e is turned on and the associated discharge transistor 50a-e is turned off. The remaining coupling transistor 54a-e of the remaining columns 14a-e are off and the remaining discharge transistors 50a-e are on.

5 Claims, 2 Drawing Figures

KEYBOARD SENSE GATE

TECHNICAL FIELD

This invention relates to a sense gate for a keyboard.

BACKGROUND ART

Various types of keyswitches are in use. Such keyswitches include a keytop for manually actuating a switch mechanism. A particularly reliable type of keyswitch is a capacitive keyswitch in which the capacitance changes in response to depression of the keytop. When used to construct a keyboard, the keyswitches are arranged in a matrix array and continually scanned to sample the condition of each individual keyswitch. In response to a depressed keyswitch, a decoder generates a coded electrical signal which is a representation of the actuated keyswitch.

Frequently, such decoder circuitry is provided with a feature called N-Key rollover. A keyboard is said to have N-Key rollover when several keyswitches may be depressed in succession with the preceding keyswitches maintained in the depressed state. The decoding circuitry, having an N-Key rollover feature, generates each corresponding keyswitch signal in the proper sequence once for each keyswitch depressed. Prior circuits for sensing and processing capacitive keyswitch keyboards have exhibited difficulty in providing an N-Key rollover feature. In such keyboards, if several keyswitches are maintained closed at the same time, there are unwanted mutliple capacitive paths between the various rows and columns comprising the keyboard matrix which may couple a signal across one or more non-depressed capacitive keyswitches. In such arrangements, the undesired capacitive coupling paths generate extraneous signals and the number of such extraneous signals is directly related to the number of keyswitches being simultaneously held in their depressed condition. This situation prevents the inclusion of a reliable N-key rollover feature in prior capacitive keyswitch keyboards.

DISCLOSURE OF THE INVENTION

The invention concerns a circuit for scanning a plurality of keyswitches arranged in a matrix having a plurality of row conductors and a plurality of column conductors. The row conductors are sequentially energized so that upon actuation of a keyswitch connecting an energized row conductor, a signal is coupled to a corresponding one of the column conductors. A plurality of column sense gates selectively couple signals on the associated column conductors to corresponding sense conductors. Each sense gate includes means, when placed in a discharge mode, for selectively discharging, in response to a first control signal, any signal present on the associated column conductor. Each gate also includes means, when placed in a conductive mode, for selectively coupling, in response to a second control signal, any signal upon the associated column conductor to the sense conductor. Additionally, the first and second control signals sequentially place one of the sense gates in the conductive mode and the remaining sense gates in the discharge mode. A coding circuit is included which is responsive to signals identifying the matrix position of a keyswitch being scanned and to the signal level upon the sense conductor for generating an encoded representation of the actuated keyswitch.

More particularly, the discharge means is in the form of a transistor connected between its associated column conductor and the common supply potential of the circuit, and the coupling means is in the form of a transistor connected between the associated column conductor and the sense conductor. The first control signal is connected directly to the gate of the coupling transistor, and the second control signal is the inversion of the first control signal and is coupled to the gate of the discharge transistor.

THE DRAWING

FIG. 1 is a schematic diagram of a keyboard including a sense gate in accordance with this invention; and FIG. 2 is a timing diagram of selected signals of the circuit of FIG. 1.

DETAILED DESCRIPTION

Figure 1:
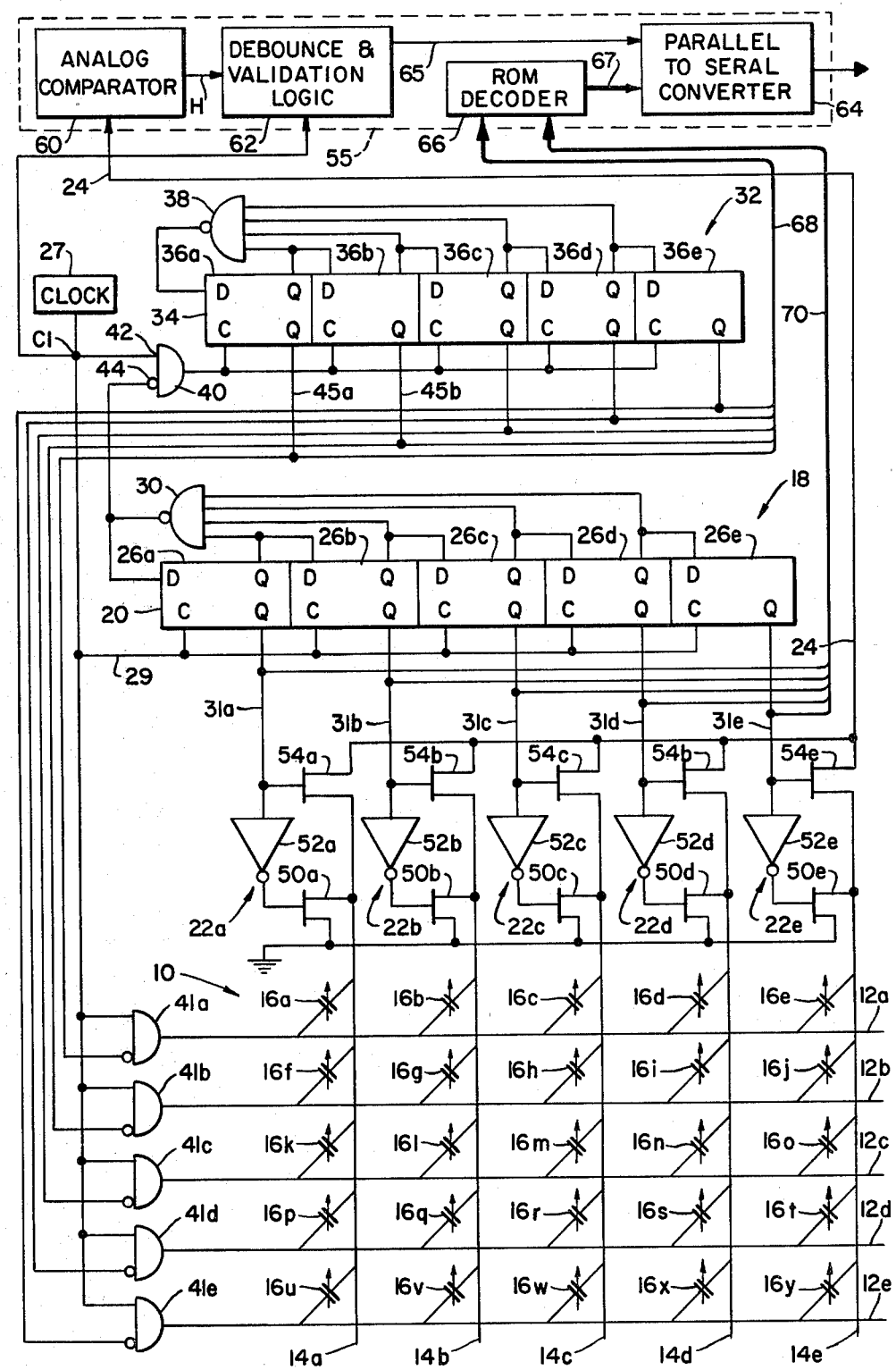

With reference to FIG. 1, a keyboard 10 is illustrated having five row conductors 12a-e and five column conductors 14a-e arranged in a matrix. Capacitive keyswitches 16a-y are placed between each row conductor 12a-e and each column conductor 14a-e to provide a twenty-five position keyboard. It will be appreciated that while the illustrated embodiment is shown utilizing twenty-five keyswitches 16a-y in a five by five conductor matrix, the number of keyswitches may be varied by increasing or decreasing the number of row and/or column conductors and associated circuitry. Upon activation of a keyswitch 16a-y, the capacitance of the keyswitch is increased thus increasing the capacitive coupling between the associated row 12a-e and column 14a-e conductors.

A column addressing circuit 18 includes a column address counter 20 which drives a plurality of column sense gates 22a-e. These gates, when in a coupling mode, couple the signal conditions on the associated column conductors 14a-e to a sense conductor 24 and, when in a discharge mode, discharge any signals on the associated column conductors 14a-e to a common supply potential. The column address counter 20 includes five type D flip-flops 26a-e in cascade. The direct output of each of the first four stages of the counter 20 is connected to one input of a four input NAND gate 30. The output of the NAND gate 30 feeds the direct input of the first flip-flop 26a. Each of the flip-flops 26a-e are clocked simultaneously by a clock signal Cl from a system clock 27 which is connected via line 29 to the clock inputs of each of the flip-flops 26a-e. When the direct outputs Q of the first four flip-flops 26a-e are high, a zero is present at the D input of the first flip-flop 26a. The next rising edge of the clock signal Cl causes the direct output Q of the first flip-flop 26a to go low and this low propagates through the column counter 20 in response to the rising edge of the clock signal Cl. The direct outputs 31a-e of the flip-flops 26a-e are also coupled to the column sense gates 22a-e. In response to the clocking signal Cl, each successive sense gate 26a-e couples the signal level on its associated column conductor 14a-e onto the sense conductor 24 as will hereinafter be further considered.

A row addressing circuit 32 includes a counter 34 having five cascaded type-D flip-flops 36a-e with the direct output Q of each of the first four flip-flops 36a-d being fed to one input of a four input NAND gate 38. The output of the NAND gate 38 is fed to the D input of the first flip-flop 36a. The clock input C of each of the flip-flops 36a-e is commonly connected to the output of a dual input AND gate 40. One input 42 of the AND gate 40 is connected directly to the output of the system clock 27 with the remaining active low input 44 of the AND gate 40 being connected to the otuput of the column counter NAND gate 30. In the presence of a high level at each of the direct Q outputs of the first four column flip-flops 26a–d, the output of the NAND gate 30 is low. The next positive edge of the clock signal Cl causes the direct output Q of the first flip-flop 36a to go low and this low output propagates through the counter in response to the rising edge of the clock signal Cl. For each counting cycle of the column counter 20, the row counter 34 is advanced, and as will subsequently be more fully appreciated, each of the keyswitches in the selected row are scanned. This column scanning process is repeated for each row 12a–e.

The direct outputs Q of each of the flip-flops 36a–e are fed to respective active low inputs of five row AND gates 41a–e. The level of the direct outputs Q of the flip-flops 36a and 36b are respectively designated 45a and 45b. Each row AND gate 41a–e also includes a second input which is connected to the system clock 27. The outputs of each of the row AND gates 41a–e are respectively connected to the row conductors 12a–e. Thus, in response to a low enable signal to a selected AND gate 41a–e from the counter 34, the enabled AND gate 41a–e couples five clock pulses to the associated row conductor 12a–e. The column counter 18 advances the sense gates 22a–e to sequentially couple the signal condition on each of the column conductors 14a–e to the sense conductor 24.

As mentioned, five sense gates 22a–e couple the signal levels on each of the column conductors 14a–e to the sense conductor 24. For purposes of discussion, the sense gate 22a will be described in detail. The remaining gates are similar in operation and construction. The sense gate 22a includes a PMOS field effect discharge transistor 50a with the drain connected to the column conductor 14a and with the source connected to the common system supply. Driving the gate of the discharge transistor 50a is the output of an inverter 52a. The input of the inverter 52a is connected to the direct output Q of the column flip-flop 26a. The direct output Q of the column flip-flop 26a is also connected to the gate of a PMOS field effect coupling transistor 54a and the drain of the transistor 54a is connected to the column conductor 14a. The source of the transistor 54a is connected to the sense conductor 24. In response to a high output from the flip-flop 26a direct output Q, the coupling transistor 54a is turned off isolating the column conductor 14a from the sense conductor 24, and the discharge transistor 50a is turned on bringing the column conductor 14a to the common supply potential. When the direct output of the column flip-flop 26a goes low, the discharge transistor 50a is turned off and the coupling transistor 54a connects the column conductor 14a directly to the sense conductor 24. Thus, when the signal level on one of the column conductors 16a–e is being sampled, the remaining column conductors are maintained at system ground thereby preventing extraneous signals from appearing on these column conductors when they are in turn sampled.

The sense conductor 24 feeds the sampled signal to a coding circuit 55 including an analog comparator 60 functioning as a level slicer. When the signal on the sense line 24 falls below a fixed value which corresponds to a sensed, closed keyswitch 16a–y, the comparator 60 feeds a signal H to a debounce and validation logic unit 62 which also receives the clock signal Cl. The debounce and validation logic 62 serves to distinguish between extraneous signals and valid key closures and provides a signal to a parallel to serial converter 64 via line 65. The debounce and validation logic unit 62 may include an N-Key rollover feature. A ROM decoder 66 is addressed by the direct outputs of the row 34 and column 20 counters via respective multi-conductor busses 68, 70. Thus, for each keyswitch 16a–y scanned, the ROM decoder 66 provides a parallel output signal on a multi-line cable 67 representing the scanned keyswitch to the parallel to serial converter 64. However, the parallel to serial converter 64 accepts the ROM decoder 66 output only in the response to a signal from the debounce and validation logic unit 62 in response to an activated keyswitch signal on line 65. The parallel output of the ROM decoder 66 on cable 67 is converted to a serial output by the converter 64 and sent to additional processing equipment (not shown).

Figure 2:
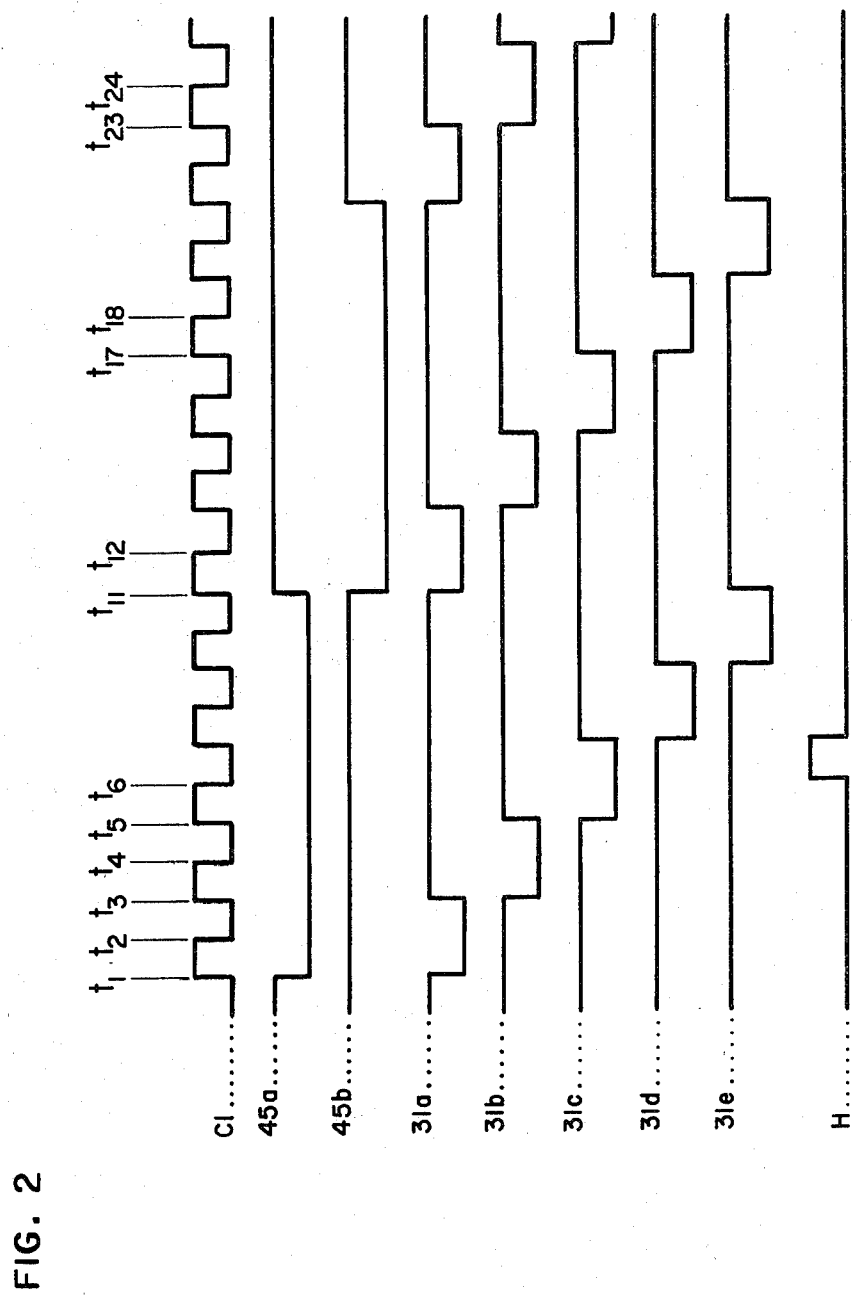

For discussional purposes, a timing diagram is illustrated in FIG. 2 showing comparative selected signal levels of the circuit of FIG. 1 in response to closure of the keyswitch 16C. The clock source 27 generates a square wave signal Cl which clocks the column counter 20 on the rising edge thereof with a low output propagating through the flip-flops 26a–e of the counter 20 in response to the rising edge of the clock signal Cl. The outputs 31a–e of the column counter 20 flip-flops 26a–e are illustrated in FIG. 2. As shown, the row counter flip-flops 36a–e propagate a low output on a rising edge of the clock signal Cl. This low output is maintained for a full cycle of the column counter before advancing. Thereafter, the low output advances to the next row flip-flop 36. It is assumed, for discussional purposes, that the keyswitch 16C is depressed at t5, and at t6 the closed keyswitch 16C couples a signal to the column conductor 14c which is coupled to the sense conductor 24 through the sense gate 22c. After successive scans of the closed keyswitch 16C, the debounce and validation logic 62 sends a signal to the converter 64 which in turn provides an encoded serial signal to an external device (not shown).

Although the invention has been particularly shown and described with reference to a preferred embodiment thereof, it will be understood that various changes in form and detail may be made without departing from the scope and spirit of the invention as defined by the following claims.

What is claimed is:

1. A circuit for scanning a plurality of keyswitches (16a–y) arranged in a matrix having a plurality of row conductors (12a–e) and a plurality of column conductors (14a–e), each of said row conductors (12a–e) being sequentially energized so that upon actuation of a keyswitch (16a–y) connecting an energized row conductor, a signal is coupled to a corresponding one of the column conductors (14a–e); a plurality of sense gates (22a–e) each of which is associated with one of the column conductors (14a–e), each of said column sense gates (22a–e) comprising:

means (50a–e) when placed in a dicharge mode for selectively discharging, in response to a first control signal, any signal present upon the associated column conductor (14a–e);

means (54a–e) when placed in a conductive mode for selectively coupling, in response to a second control signal, any signal upon the associated column conductor (14a–e) to a sense conductor (24), said selective discharge means (50*a-e*) and coupling means (54*a-e*) being alternatively operative;

means (18) for sequentially supplying said second control signals to said column sense gates (22*a-e*) so as to sequentially place said coupling means (54*a-e*) of each of said sense gates (22*a-e*) in the coupling mode and for placing the remaining sense gates (22*a-*) in the discharge mode; and a coding circuit (60, 62, 64, 66) responsive to signals identifying the matrix position of a keyswitch (16*a-y*) location currently being scanned and to the signal upon said sense conductor (24) for generating a coded representation of the actuated keyswitch.

2. The circuit of claim 1 wherein said discharing means comprises a discharge transistor connected between the associated column conductor (16*a-e*) and the common potential of the circuit, said discharge transistor (50*a-e*) being responsive to said first control signal; and said coupling means comprising a coupling transistor (54*a-e*) connected between the associated column conductor (16*a-e*) and said sense conductor (24) and said coupling transistor being rendered conductive in response to said second control signal.

3. The circuit of claim 2 wherein said first control signal is connected directly to said coupling transistor (54*a-e*), said second control signal is the inversion of said first control signal and said second control signal is coupled to said discharge transistor (50*a-e*).

4. The circuit of claims 1, 2, or 3 wherein said keyswitches (16*a-e*) are capacitive.

5. The circuit of claim 2 wherein said first and second control signals are generated by a column address counter (20) and said short duration signal is switched to each of said rows by a row address counter (34), said column address counter (26) scanning each of said columns for each row address.

* * * * *